(12) United States Patent
Jin et al.

(10) Patent No.: US 11,769,691 B2
(45) Date of Patent: Sep. 26, 2023

(54) SEMICONDUCTOR DEVICE AND FORMATION METHOD THEREOF

(71) Applicants:Semiconductor Manufacturing International (Shanghai) Corporation, Shanghai (CN); Semiconductor Manufacturing International (Beijing) Corporation, Beijing (CN)

(72) Inventors: Jisong Jin, Shanghai (CN); Abraham Yoo, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 134 days.

(21) Appl. No.: 17/249,540

(22) Filed: Mar. 4, 2021

(65) Prior Publication Data
US 2021/0280458 A1  Sep. 9, 2021

(30) Foreign Application Priority Data

Mar. 5, 2020 (CN) .......................... 202010148370.5

(51) Int. Cl.
  *H01L 21/768* (2006.01)
  *H01L 21/311* (2006.01)
(52) U.S. Cl.
  CPC .. *H01L 21/76816* (2013.01); *H01L 21/31144* (2013.01)

(58) Field of Classification Search
  CPC .................. H01L 21/76816; H01L 21/31144
  See application file for complete search history.

(56) References Cited

U.S. PATENT DOCUMENTS

| 9,773,680 B1 * | 9/2017 | Zang | H01L 21/823431 |
| 10,937,652 B1 * | 3/2021 | Tien | H01L 21/76816 |
| 2015/0243503 A1 * | 8/2015 | Leobandung | H01L 21/28132 438/427 |

* cited by examiner

*Primary Examiner* — Monica D Harrison
*Assistant Examiner* — Andre C Stevenson
(74) *Attorney, Agent, or Firm* — Anova Law Group, PLLC

(57) ABSTRACT

The method includes providing a to-be-etched layer including an first region and a second region adjoining the first region, forming a first mask layer on the to-be-etched layer, forming a patterned core layer on the first mask layer of the first region, forming a sidewall spacer on the core layer and the first mask layer, forming a first sacrificial layer on the sidewall spacer on the surface of the first mask layer of the second region, forming a second sacrificial layer on the sidewall spacer, removing the first sacrificial layer, the sidewall spacer on the surface of the first mask layer of the second region, and the sidewall spacer on a top of the core layer, removing the core layer, etching the first mask layer of the first region to form a first trench, and etching the first mask layer of the second region to form a second trench.

10 Claims, 15 Drawing Sheets

SEMICONDUCTOR DEVICE AND FORMATION METHOD THEREOF

CROSS-REFERENCE TO RELATED APPLICATION

This application claims the priority of Chinese Patent Application No. 202010148370.5, filed on Mar. 5, 2020, the entire content of which is hereby incorporated by reference.

FIELD OF THE DISCLOSURE

The present disclosure generally relates to the field of semiconductor manufacturing technology field and, more particularly, relates to a semiconductor device formation method.

BACKGROUND

With the improvement of integration and scale of a circuit, a size of a unit device continues to decrease in the circuit, and requirements of an integrated circuit (IC) manufacturing process continues to increase. For example, a critical dimension continues to decrease, and chip manufacturing has an increasing requirement for lithography resolution. As a design size continues to decrease, a smallest resolution of a design image has exceeded a limit capability of an existing optical lithography platform. A plurality of technical solutions are used to solve this technical problem. According to the blueprint of international semiconductor technology, the technical solutions of dual patterning technology (DPT), extreme ultraviolet technology (EUV), electron beam lithography (EBL), etc., are interested in the semiconductor industry.

A plurality of two-time patterning processes are provided. The two-time patterning process using a litho-etch-litho-etch (LELE) process is a common method of the existing plurality of two-time patterning processes. The LELE process method needs to divide the image into two parts. Then, each of the two separate photolithography processes generates a portion of the pattern, respectively. However, lithography, etching, and deposition may generate an edge placement error (EPE), which results in a vertical alignment deviation between layers. The EPE may eventually affect the performance of the formed semiconductor device. To reduce the EPE, a patterning technology based on a sidewall process is provided, e.g., self-alignment LELE technology based on the sidewall process.

When the self-alignment LELE technology based on the sidewall process is used to form a metal wire, a first trench is generally formed first, then a sidewall is formed on an inner surface of the first trench. The sidewall is used as an alignment reference for second photolithography. As such, self-alignment is realized for forming a second trench by the second photolithography, and the EPE is reduced. Then, a base substrate is patterned based on the first trench, the sidewall of the inner surface of the first trench, and the second trench.

However, when metal is filled in the first trench to form a first metal wire, the sidewall on the inner surface of the first trench affects a head to head (HTH) of formed neighboring first metal wires. Therefore, a dimension of the HTH between the formed neighboring first metal wires is large, and the dimension of the formed HTH does not match an expected target.

BRIEF SUMMARY OF THE DISCLOSURE

The present disclosure provides a method for forming a semiconductor device to reduce a dimension of a device, form a smaller dimension of a head to head (HTH), and cause the HTH to match an expected target.

One aspect of the present disclosure includes a method for forming a semiconductor device. The method includes providing a to-be-etched layer including an first region and a second region adjoining the first region, forming a first mask layer on the to-be-etched layer, forming a patterned core layer on the first mask layer of the first region, forming a sidewall spacer on a top and a sidewall surface of the core layer and a surface of the first mask layer, forming a first sacrificial layer on the sidewall spacer on the surface of the first mask layer of the second region, forming a second sacrificial layer on the sidewall spacer, removing the first sacrificial layer, the sidewall spacer on the surface of the first mask layer of the second region and the sidewall spacer on the top of the core layer, removing the core layer, etching the first mask layer of the first region to form a first trench, and etching the first mask layer of the second region to form a second trench. The second sacrificial layer exposes the sidewall spacer on the top of the core layer and a top of the first sacrificial layer.

Optionally, forming the first sacrificial layer includes forming a first sacrificial material layer on a surface of the sidewall spacer, forming a patterned photoresist layer on the first sacrificial material layer, the patterned photoresist layer covering the first sacrificial material layer of the second region, and using the patterned photoresist layer as a mask to etch the first sacrificial material layer to form the first sacrificial layer on the sidewall spacer on the surface of the first mask layer of the second region.

Optionally, forming the second sacrificial layer includes forming a second sacrificial material layer on a surface of the sidewall spacer and a surface of the first sacrificial layer, and etching back the second sacrificial material layer until exposing the sidewall spacer on the top of the core layer and a top of the first sacrificial layer to form the second sacrificial layer.

Optionally, a material of the first sacrificial layer includes spin-coated carbon, spin-coated glass, spin-coated organic, or spin-coated metal oxide.

Optionally, removing the first sacrificial layer includes at least one of a dry etching or a wet etching.

Optionally, a material of the second sacrificial layer includes spin-coated carbon, spin-coated glass, spin-coated organic, or spin-coated metal oxide.

Optionally, etching back the second sacrificial layer includes at least one of a dry etching or a wet etching.

Optionally, a material of the sidewall spacer includes silicon oxide ($SiO_2$), silicon nitride (SiN), titanium oxide ($TiO_2$), titanium nitride (TiN), aluminum nitride (AlN), or aluminum oxide ($Al_2O_3$).

Optionally, after forming the first trench and the second trench, the method further includes removing the second sacrificial layer and the sidewall spacer on the sidewall surface of the core layer.

Optionally, the method further includes etching the to-be-etched layer at bottom of the first trench to form a first target trench in the to-be-etched layer of the first region and etching the to-be-etched layer at bottom of the second trench to form a second target trench in the to-be-etched layer of the second region.

Optionally, the method further includes forming a first conductive layer in the first target trench and forming a second conductive layer in the second target trench.

As disclosed, the technical solutions of the present disclosure have the following advantages.

Before the first trench and the second trench are formed in the first mask layer, the patterned core layer is formed on the mask layer first, then the sidewall spacer is formed on the surface of the core layer and the surface of the first mask layer, and the first sacrificial layer covering the sidewall spacer on the mask layer of the second region is subsequently formed. On one aspect, the core layer defines the position and dimension of the first trench to be formed. The first sacrificial layer defines the position and dimension of the second trench. The sidewall spacer is used as the alignment reference for forming the first sacrificial layer to reduce the alignment error between the formed second trench and the first trench. On another aspect, the sidewall spacer is formed before the first trench. The core layer and the first mask layer at the bottom of the core layer are etched and removed to form the first trench. After the first trench is formed, the sidewall spacer configured for self-alignment does not need to be formed in the first trench, therefore, the shape of the formed first trench is consistent with the shape of the core layer. When the shape of the first trench is transferred to the to-be-etched layer, the shape of the formed first target trench is consistent with the shape of the core layer. Moreover, when the metal is filled in the first target trench to form the first conductive layer, no sidewall spacer exists between the neighboring first conductive layers to realize a smaller HTH. The HTH between the neighboring first conductive layers is the HTH between the neighboring core layers, which matches the expected target.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions, and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

When a metal wire is formed by using a self-alignment LELE technology, a head to head (HTH) between formed neighboring metal wires is still large and does not match an expected target.

FIGS. 1 to 5 illustrate schematics of semiconductor structures corresponding to certain stages of a process for forming a semiconductor device.

Figure 1:
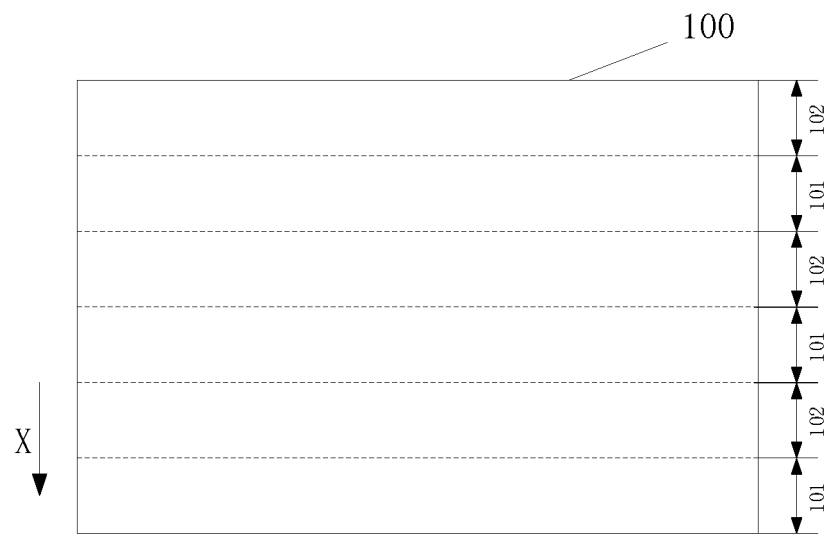
FIGS. 1 to 5 illustrate schematics of semiconductor structures corresponding to certain stages of a process for forming a semiconductor device.

Referring to FIG. 1, a to-be-etched layer 100 is provided. The to-be-etched layer 100 includes a plurality of separate first regions 101 and a plurality of separate second regions 102. The plurality of first regions 101 and the plurality of second regions 102 are alternatively arranged along a first direction X. A first region 101 adjoins a second region 102.

Figure 2:
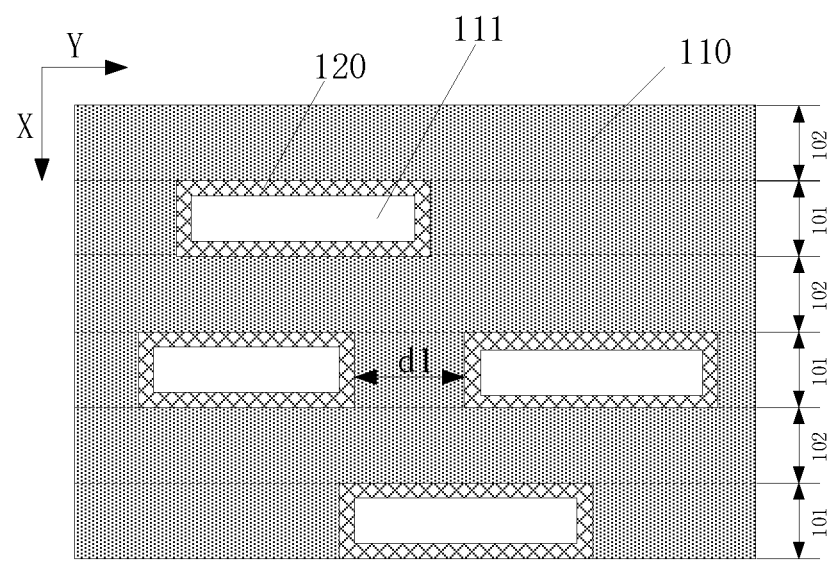

Referring to FIG. 2, a first mask layer 110 is formed on the plurality of first regions 101 and the plurality of second regions 102 of the to-be-etched layer 100. A plurality of separate first trenchs 111 are formed in the first mask layer 110 of the plurality of first regions 101.

The HTH between neighboring first trenchs 111 along a second direction Y is d1. The second direction Y is perpendicular to the first direction X.

Referring back to FIG. 2, a sidewall spacer 120 is formed on a sidewall surface of a first trench 111. The sidewall spacer 120 is used as an alignment reference for subsequently forming a second trench by second photolithography.

Figure 3:
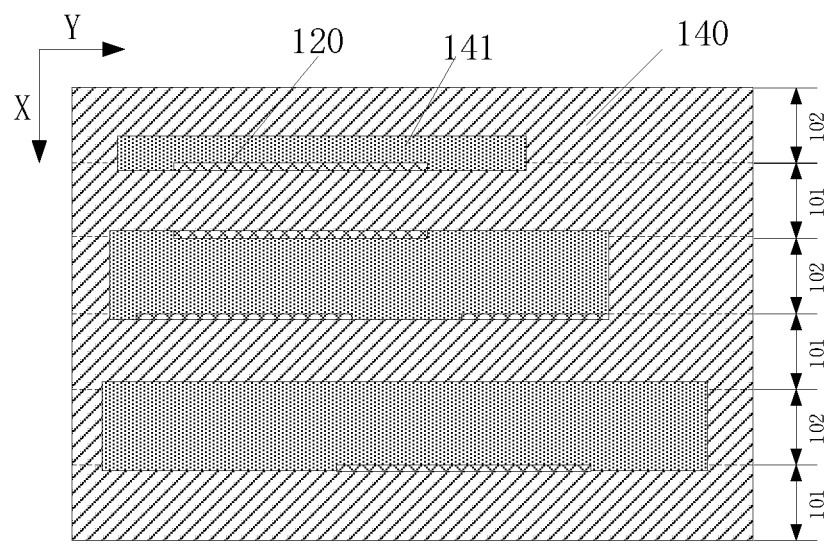

Referring to FIG. 3, a first patterned layer 140 is formed on the first mask layer 110. The first patterned layer 140 includes a plurality of openings 141. Each opening 141 exposes a portion of the first mask layer 110 of the second region 102 and a portion of a top surface of the sidewall spacer 120 of the sidewall surface of the first trench 111.

An opening 141 may define a position and a dimension of a second trench to be formed.

The sidewall spacer 120 may include the alignment reference for forming the first patterned layer 140, forming the opening 141 in the first patterned layer 140, and the subsequent second etching to reduce an edge placement error (EPE).

Figure 4:
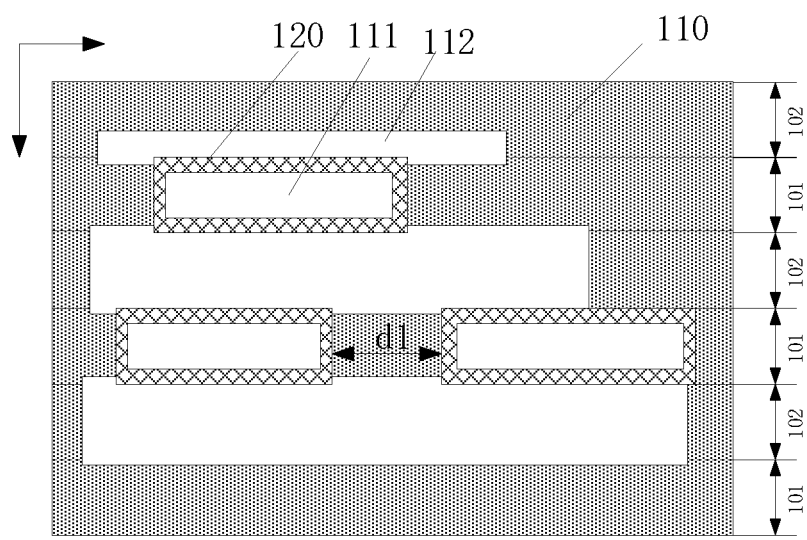

Referring to FIG. 4, the first patterned layer 140 is used as a mask to etch the first mask layer 110 exposed by the opening 141 to form the separate second trench 112 in the first mask layer 110 of the second region 102. A sidewall surface of the second trench 112 exposes the sidewall spacer 120. The first patterned layer 140 is removed.

Figure 5:
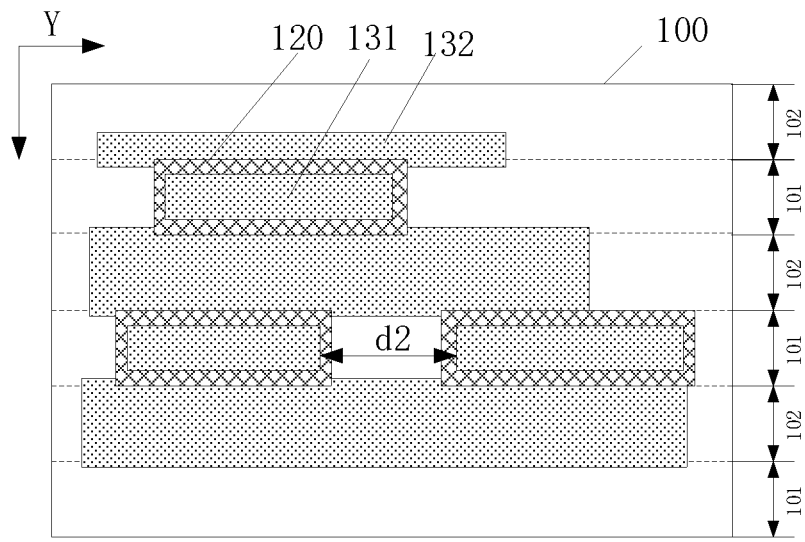

Referring to FIG. 5, the to-be-etched layer 100 at bottom of the first trench 111 is etched to form a first target trench (not shown) in the to-be-etched layer 100. The to-be-etched layer 100 at bottom of the second trench 112 is etched to form a second target trench (not shown) in the to-be-etched layer 100. A first metal wire 131 is formed in the first target trench, and a second metal wire 132 is formed in the second target trench.

An HTH between neighboring first metal wires 131 along the second direction Y is d2.

The inventors of the present disclosure have found that that a semiconductor device formed by the method described above may have an undesirable dimension of the HTH of the neighboring first metal wires. In this method, the first trench is first formed, and then the sidewall spacer is formed on the sidewall surface of the first trench. The formed sidewall spacer is located in the first trench. When the metal is subsequently filled in the first trench to form the first metal wire, the HTH between the neighboring first metal wires is d2. That is, the dimension of the HTH is a sum of the HTH d1 of the first trench and thicknesses of two sidewall spacers, which cause the dimension of the HTH of the formed neighboring first metal wires not to satisfy a minimal dimension requirement and match the expected target. To form an HTH with a smaller dimension, a cut process may need to be performed additionally. A first metal layer formed by cutting may increase the cost. Moreover, since no sidewall spacer is formed on the sidewall surface of the second trench, the dimension of the HTH of the neighboring first metal wires may have a large difference from the dimension of the HTH of the neighboring second metal wires, which may cause a wire connecting process between the metal wires difficult to perform and affect the performance of the semiconductor device negatively.

To solve the above-described problem, the inventors of the present disclosure have found through research that a forming method may be provided to form the semiconductor device. Before forming the first trench in the first mask layer, a patterned core layer may be formed on the first mask layer. The patterned core layer may define the position and dimension of the first trench to be formed. Then, a sidewall spacer may be formed on a sidewall surface and a top surface of the core layer. A first sacrificial layer may be formed on the sidewall spacer of the surface of the first mask layer of the second region. The first sacrificial layer may define the position and dimension of the second trench. The second trench and the first trench may be subsequently formed, respectively, by etching to remove the first sacrificial layer and the first mask layer at the bottom of the first sacrificial layer and etching to remove the core layer and the first mask layer at the bottom of the core layer. On one aspect, the sidewall spacer may be used as the alignment reference for the second photolithography to reduce an alignment error with the core layer when the first sacrificial layer is formed, that is, reduce the alignment error between the second trench and the first trench to be formed, which may improve the performance of the semiconductor device. On another aspect, the sidewall spacer is formed before the first trench is formed and is located outside of the first trench. When the to-be-etched layer is subsequently etched to form a first conductive layer based on the first trench, an HTH of neighboring first conductive layers may not be affected by the sidewall spacer. The HTH may reach a limit of capability of the photolithography. The position and the dimension of the formed first conductive layer may be the same as the core layer. The dimension of the formed HTH may match the expected target.

To make the purpose, feature, and beneficial effect clearer, specific embodiments of the present disclosure are described in detail in connection with accompanying drawings.

Figure 28:
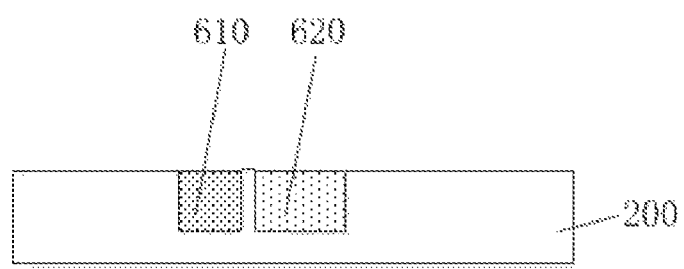
Figure 29:
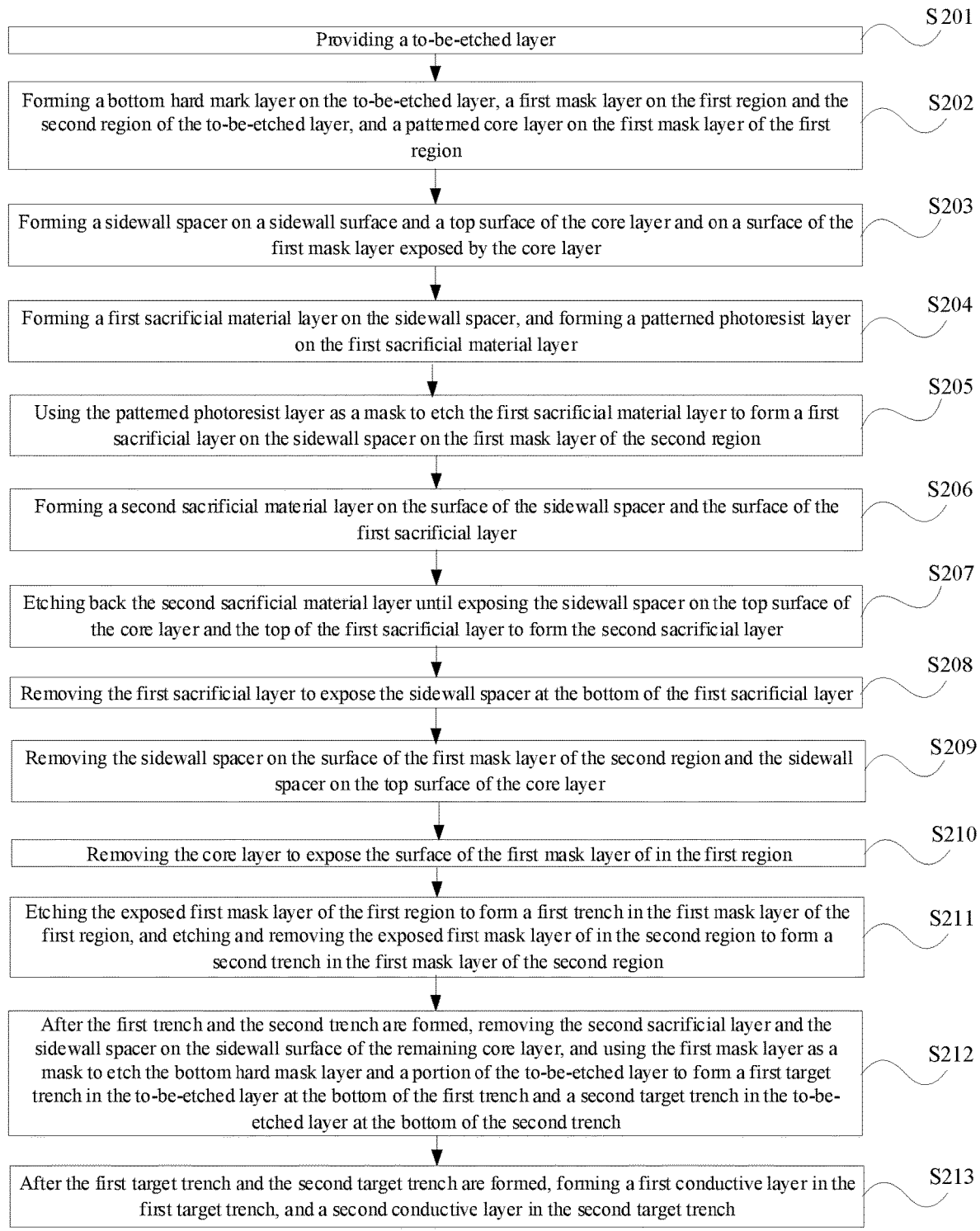
FIG. 29 illustrates an exemplary process for forming a semiconductor device consistent with the disclosed embodiments of the present disclosure.

FIG. 29 illustrates an exemplary process for forming a semiconductor device consistent with the disclosed embodiments of the present disclosure. FIGS. 6 to 28 illustrate schematics of semiconductor structures corresponding to certain stages of the exemplary process for forming a semiconductor device consistent with the disclosed embodiments of the present disclosure.

Figure 6:
FIGS. 6 to 28 illustrate schematics of semiconductor structures corresponding to certain stages of an exemplary process for forming a semiconductor device consistent with the disclosed embodiments of the present disclosure.

As shown in FIG. 29, a to-be-etched layer is provided (S201). FIG. 6 illustrates a corresponding semiconductor structure.

Referring to FIG. 6, a to-be-etched layer 200 is provided. The to-be-etched layer 200 includes a first region A1 and a second region A2 adjoining the first region A1.

In some embodiments, one first region A1 and one second region A2 are used as an example for description.

In some other embodiments, the to-be-etched layer 200 may include a plurality of first regions and a plurality of second regions. The first regions and the second regions may be arranged alternatively. A first region adjoins a second region. An alternative arrangement may refer to that only one second region is between two neighboring first regions, and only one first region is between two neighboring second regions.

In some embodiments, a region not marked with the first region or the second region may be considered as another region, which does not form a first conductive layer or a second conductive layer.

In some embodiments, the to-be-etched layer 200 may include a low K dielectric layer (e.g., K smaller than or equal to 3.9). In some other embodiments, a material of the to-be-etched layer 200 may include silicon oxide ($SiO_2$).

Figure 7:
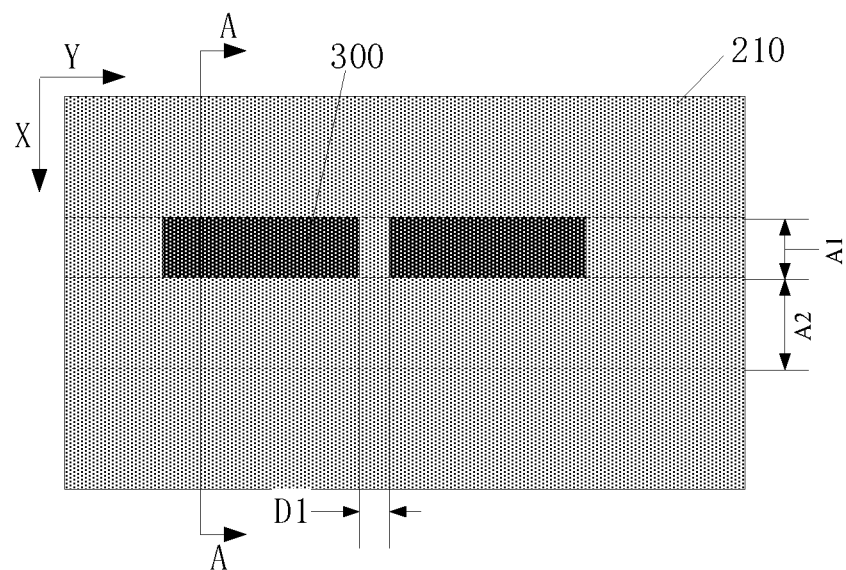
Figure 8:
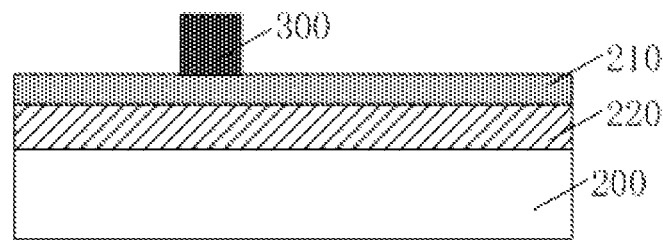

As shown in FIG. 29, a bottom hard mark layer is formed on the to-be-etched layer first, then a first mask layer is formed on the first region and the second region of the to-be-etched layer, and subsequently, a patterned core layer is formed on the first mask layer of the first region (S202). FIG. 7 and FIG. 8 illustrate corresponding semiconductor structures.

FIG. 7 is a schematic diagram based on FIG. 6. FIG. 8 is a cross-sectional view of FIG. 7 along line A-A. A first mask layer 210 is formed on the first region A1 and the second region A2 of the to-be-etched layer 200.

In some embodiments, before the first mask layer 210 is formed, a bottom hard mask layer 220 may be formed on the to-be-etched layer 200.

In some embodiments, the bottom hard mask layer 220 may contact the to-be-etched layer 200.

A material of the bottom hard mask layer 220 may include titanium nitride (TiN).

A material of the first mask layer 210 may include silicon oxide ($SiO_2$) or silicon nitride (SiN). In some embodiments, the material of the first mask layer 210 may include silicon oxide ($SiO_2$).

The bottom hard mask layer 220 may include the following functions. The bottom hard mask layer 220 may be used as an etching stop layer. The bottom hard mask layer 220 may be used as a stop layer for subsequently planarizing a conductive film. A material of the bottom hard mask layer 220 may include a hard mask material. Thus, when a first target trench and a second target trench are formed by etching, etching loss of the bottom hard mask layer 220 may be small, and pattern transfer may have high stability during the process of transferring the pattern in the bottom hard mask layer 220 to the to-be-etched layer.

Referring back to FIG. 7 and FIG. 8, after the first mask layer 210 is formed, a patterned core layer 300 is formed on the first mask layer 210 of the first region A1.

In some embodiments, forming the patterned core layer 300 includes forming a core material layer on the first mask layer 210, forming a patterned photoresist layer on the core material layer, using the patterned photoresist layer as a mask to etch the core material layer until exposing a surface of the first mask layer 210 to form the patterned core layer 300, and removing the patterned photoresist layer. The patterned photoresist layer may define a position and dimension of the core layer to be formed.

A material of the core layer 300 may include polysilicon, amorphous carbon, an organic dielectric layer (ODL) material, a bottom anti-reflective coating (BARC) material, a dielectric anti-reflective coating (DARC) material, or a Si-ARC material.

In some embodiments, the material of the core layer 300 may include amorphous carbon.

In some embodiments, the dimension and position of the core layer 300 may correspond to the dimension and position of the first target trench formed subsequently in the to-be-etched layer 200.

In some embodiments, a width of the core layer 300 along a first direction X may be substantially equal to a width of the first region A1 along the first direction X. In some other embodiments, the width of the core layer 300 along the first direction X may not be equal to the width of the first region A1 along the first direction X.

In some embodiments, two portions of the core layer 300 may be formed. The two portions of the core layer 300 may be arranged on a same straight line along a second direction Y. An HTH between the two portions of the core layer 300 may be D1. The second direction Y may be perpendicular to the first direction X.

In some other embodiments, any number of the portions of the formed core layer 300 may be formed, which is not limited by the present disclosure.

Figure 9:
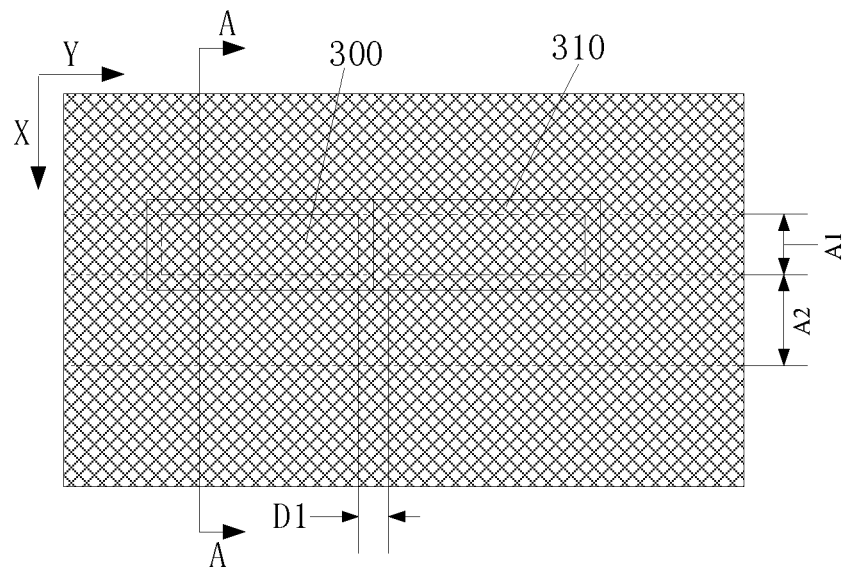
Figure 10:
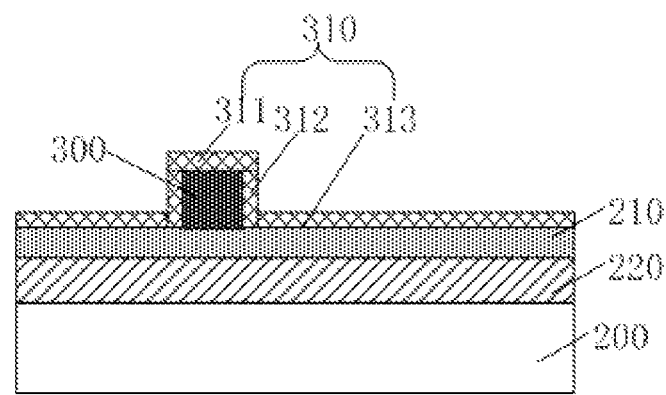

As shown in FIG. 29, a sidewall spacer is formed on a sidewall surface and a top surface of the core layer and on a surface of the first mask layer exposed by the core layer (S203). FIG. 9 and FIG. 10 illustrate corresponding semiconductor structures.

FIG. 9 and FIG. 7 provide schematic views of structures of a same top view direction. FIG. 10 and FIG. 8 provide schematic views of structures of a same cross-section. A sidewall spacer 310 is formed on a sidewall surface and a top surface of the core layer 300 and on a surface of the first mask layer 210 exposed by the core layer 300.

A material of the sidewall spacer 310 may be different from the material of the core layer 300. Therefore, a subsequent process of removing the sidewall spacer 310 or the core layer 300 may cause the core layer 300 or the sidewall spacer 310 to have a larger etching selectivity ratio over the sidewall spacer 310 other. Moreover, the material of the sidewall spacer 310 may be different from the material of the first mask layer 210. Therefore, the sidewall spacer 310 may have a larger etching selectivity ratio over the first mask layer 210.

In some embodiments, the material of the sidewall spacer 310 may include titanium oxide ($TiO_2$). In some other embodiments, the material of the sidewall spacer 310 may include silicon oxide ($SiO_2$), silicon nitride (SiN), titanium nitride (TiN), aluminum nitride (AlN), or aluminum oxide ($Al_2O_3$).

The sidewall spacer 310 may be formed by a chemical vapor deposition (CVD) process, a physical vapor deposition (PVD) process, or an atomic layer deposition (ALD) process. In some embodiments, the ALD process may be used to form the sidewall spacer 310 to cause the formed sidewall spacer 310 to have a great step covering ability.

In some embodiments, to facilitate subsequent description, the sidewall spacer 310 includes a first sidewall spacer 311 on the top surface of the core layer 300, a second sidewall spacer 312 on the sidewall surface of the core layer 300, and a third sidewall spacer 313 on the surface of the first mask layer 210.

In some embodiments, a width of the core layer 300 along the first direction X may be substantially equal to the width of the first region A1 along the first direction X. A portion of the second sidewall material layer 312 may be located in the second region A2.

After the sidewall spacer 310 is formed, a first sacrificial layer is formed on the sidewall spacer 310 of the surface of the first mask layer 210 of the second region A2.

In some embodiments, forming the first sacrificial layer may include the following processes.

Figure 11:
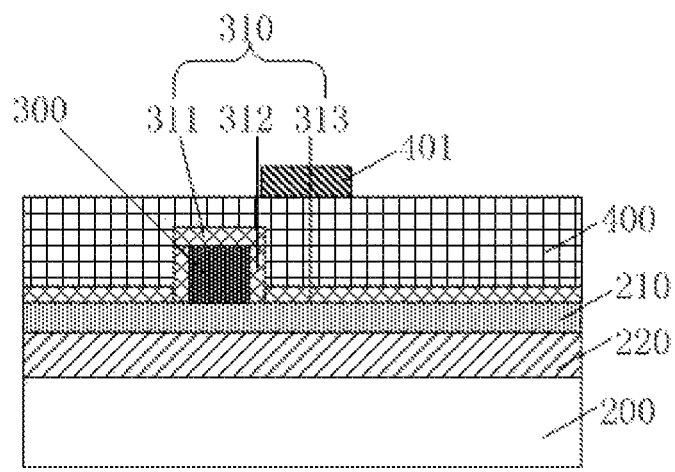

As shown in FIG. 29, a first sacrificial material layer is formed on the sidewall spacer, and a patterned photoresist layer is formed on the first sacrificial material layer (S204). FIG. 11 illustrates a corresponding semiconductor structure.

FIG. 11 and FIG. 8 provide schematic views of structures of the same cross-section. A first sacrificial material layer 400 is formed on the sidewall spacer 310.

In some embodiments, the first sacrificial material layer 400 covers the first sidewall spacer 311, the second sidewall spacer 312, and the third sidewall spacer 313.

In some embodiments, a material of the first sacrificial material layer 400 may include spin-coated organic. In some other embodiments, the material of the first sacrificial material layer 400 may further include spin-coated carbon, spin-coated glass, or spin-coated metal oxide.

In some embodiments, the first sacrificial material layer 400 may be formed by a spin-coating method.

Referring back to FIG. 11, a patterned photoresist layer 401 is formed on the first sacrificial material layer 400. The patterned photoresist layer 401 covers the first sacrificial material layer 400 of the second region A2.

In some embodiments, forming the patterned photoresist layer 401 may include depositing a photoresist material on the first sacrificial material layer 400, and performing exposure and development on the photoresist material to form the patterned photoresist layer 401. The patterned photoresist layer 401 may cover the first sacrificial material layer 400 of the second region A2.

In some embodiments, the patterned photoresist layer 401 may define a position and dimension of the first sacrificial layer to be formed.

In some embodiments, the sidewall spacer 310 may be used as an alignment reference for forming the first sacrificial layer to reduce the alignment error between the first sacrificial layer and the core layer 300. The first sacrificial layer may define the position and dimension of the second trench to be formed subsequently, thus, the position errors of the first trench and the second trench may be reduced.

Figure 12:
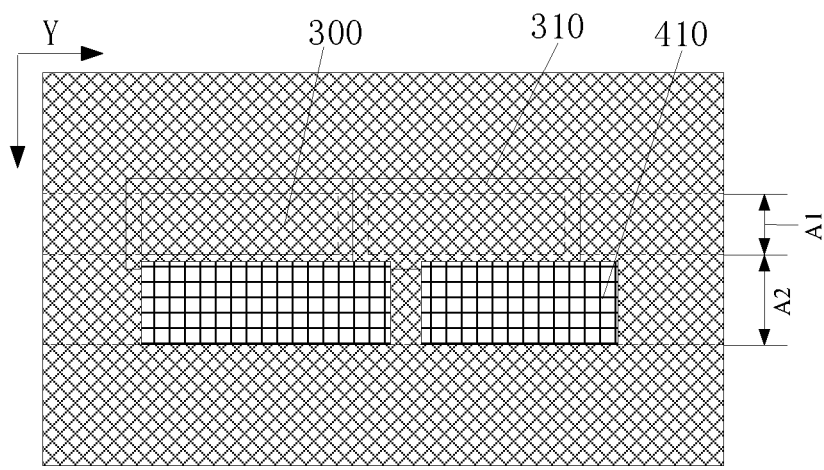
Figure 13:
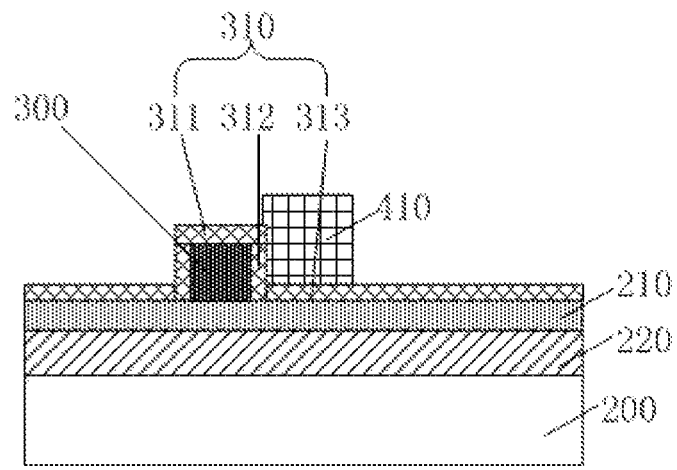

As shown in FIG. 29, the patterned photoresist layer is used as a mask to etch the first sacrificial material layer to form a first sacrificial layer on the sidewall spacer on the first mask layer of the second region (S205). FIG. 12 and FIG. 13 illustrate corresponding semiconductor structures.

FIG. 12 and FIG. 9 provide schematic views of structures of the same top view direction. FIG. 13 and FIG. 11 provide schematic views of structures of the same cross-section. The patterned photoresist layer 401 is used as a mask to etch the first sacrificial material layer 400 to form the first sacrificial layer 410 on the sidewall spacer 310 on the first mask layer 210 of the second region A2.

Correspondingly, in some embodiments, a material of the first sacrificial layer 410 may include the spin-coated organic. In some other embodiments, the material of the first sacrificial layer 410 may further include the spin-coated carbon, spin-coated glass, or spin-coated metal oxide.

In some embodiments, the first sacrificial layer 410 may cover the third sidewall spacer 313 on the first mask layer 210 of the second region A2.

In some embodiments, the first sacrificial layer 410 may further cover a portion of the top surface of the second sidewall spacer 312 located in the second region A2. In some other embodiments, the first sacrificial layer 410 may further cover the whole top surface of the second sidewall spacer 312 located in the second region A2.

After the first sacrificial layer 410 is formed, a second sacrificial layer may be formed on the sidewall spacer 310 exposed by the first sacrificial layer 410. The second sacrificial layer may expose the top of the sidewall spacer 310 on the top surface of the core layer 300 and the top of the first sacrificial layer 410.

In some embodiments, forming the second sacrificial layer may include the following processes.

Figure 14:
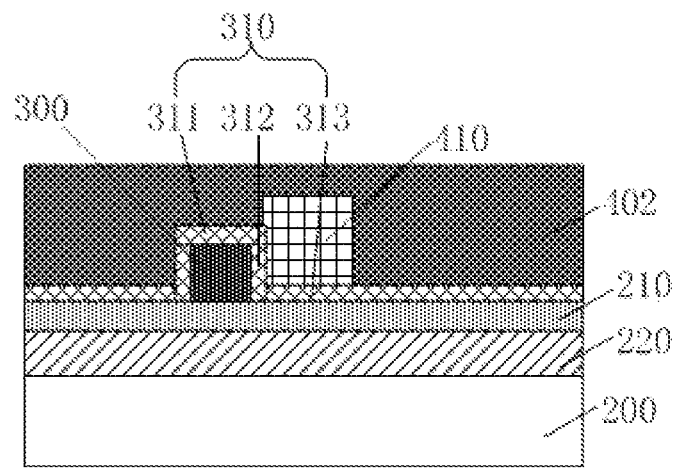

As shown in FIG. 29, a second sacrificial material layer is formed on the surface of the sidewall spacer and the surface of the first sacrificial layer (S206). FIG. 14 illustrates a corresponding semiconductor structure.

FIG. 14 and FIG. 13 provide schematic views of structures of the same cross-section A second sacrificial material layer 402 is formed on the surface of the sidewall spacer 310 and the surface of the first sacrificial layer 410.

In some embodiments, a material of the second sacrificial material layer 402 may include spin-coated silicon oxide. In some other embodiments, the material of the second sacrificial material layer 402 may further include spin-coated carbon, spin-coated glass, spin-coated organic, or other spin-coated metal oxides.

In some embodiments, forming the second sacrificial material layer 402 may include a spin coating method.

In some embodiments, forming the second sacrificial layer includes performing a planarization process on the second sacrificial material layer 402.

Figure 15:
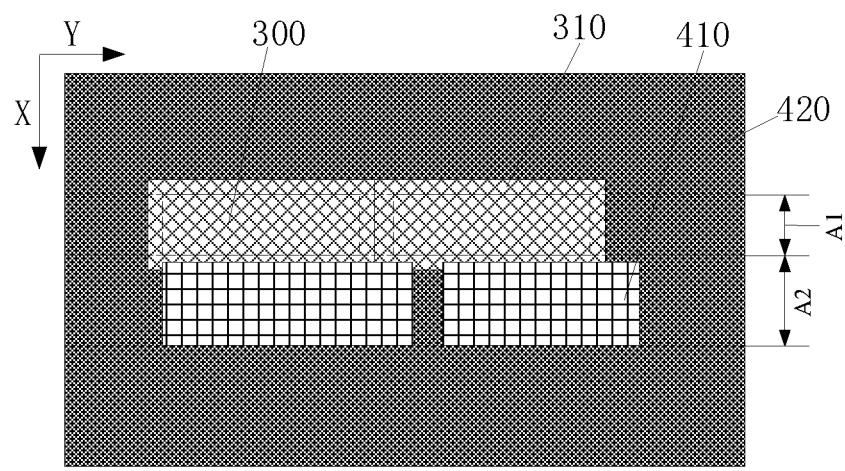
Figure 16:
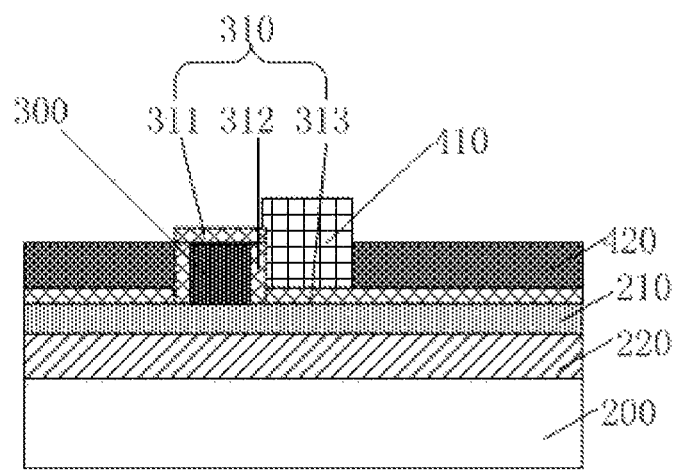

As shown in FIG. 29, the second sacrificial material layer is etched back until exposing the sidewall spacer on the top surface of the core layer and the top of the first sacrificial layer to form the second sacrificial layer (S207). FIG. 15 and FIG. 16 illustrate corresponding semiconductor structures.

FIG. 15 and FIG. provide schematic views of structures of the same top view direction. FIG. 16 and FIG. 14 provide schematic views of structures of the same cross-section. The second sacrificial material layer 402 is etched back until the exposing sidewall spacer 310 of the top surface of the core layer 300 and the top of the first sacrificial layer 410 to form a second sacrificial layer 420.

The top of the second sacrificial layer 420 may be lower than the top surface of the core layer 300, or co-planer with the top surface of the core layer 300. As long as the whole sidewall spacer 310 of the top surface of the core layer 300 is exposed.

Correspondingly, in some embodiments, a material of the second sacrificial layer 420 may include the spin-coated silicon oxide. In some other embodiments, the material of the second sacrificial layer 420 may further include the spin-coated carbon, spin-coated glass, spin-coated organic, or other spin-coated metal oxides.

Etching back the second sacrificial material layer 402 may include at least one of a dry etching or a wet etching.

Figure 17:
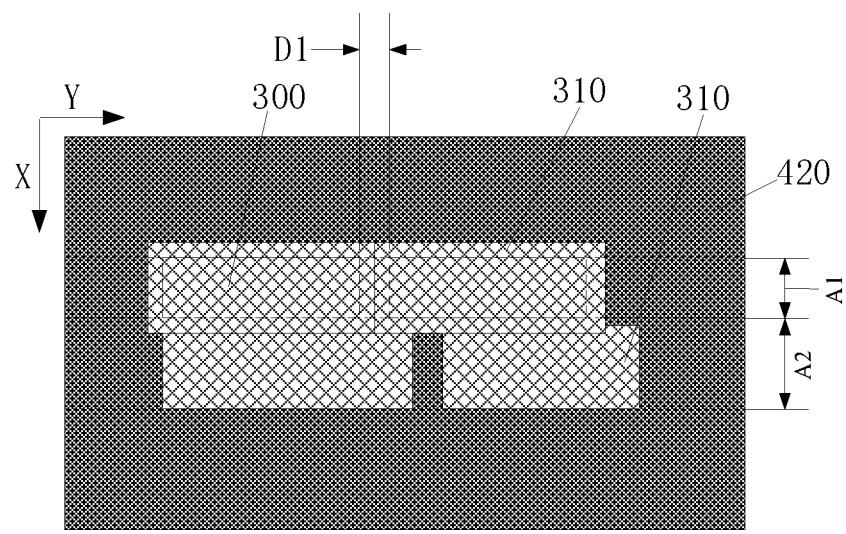
Figure 18:
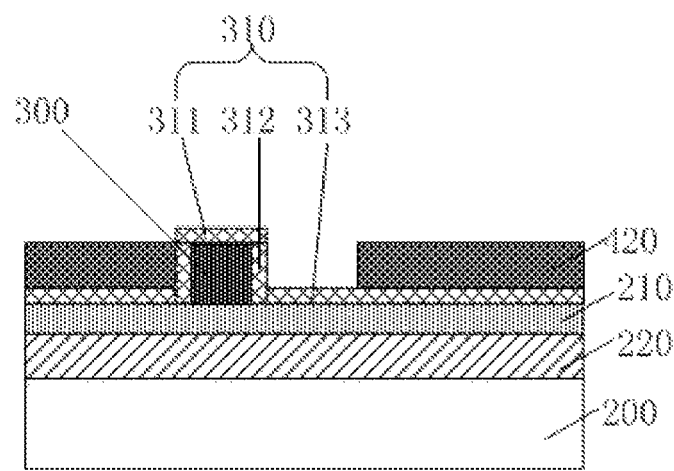

As shown in FIG. 29, the first sacrificial layer is removed to expose the sidewall spacer at the bottom of the first sacrificial layer (S208). FIG. 17 and FIG. 18 illustrate corresponding semiconductor structures.

FIG. 17 and FIG. 15 provide schematic views of structures of the same top view direction. FIG. 18 and FIG. 16 provide schematic views of structures of the same cross-section. The first sacrificial layer 410 is removed to expose the sidewall spacer 310 at the bottom of the first sacrificial layer 410.

Removing the first sacrificial layer 410 may include at least one of the dry etching or the wet etching.

In some embodiments, the first sacrificial layer 410 may have a higher etching selectivity ratio over the second sacrificial layer 420. The etching may be better controlled when the first sacrificial layer 410 is etched to be removed.

Figure 19:
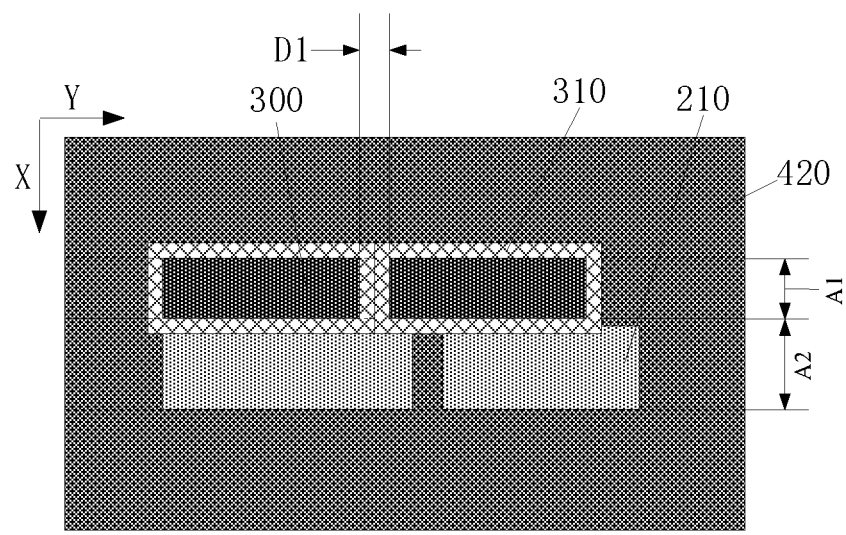
Figure 20:
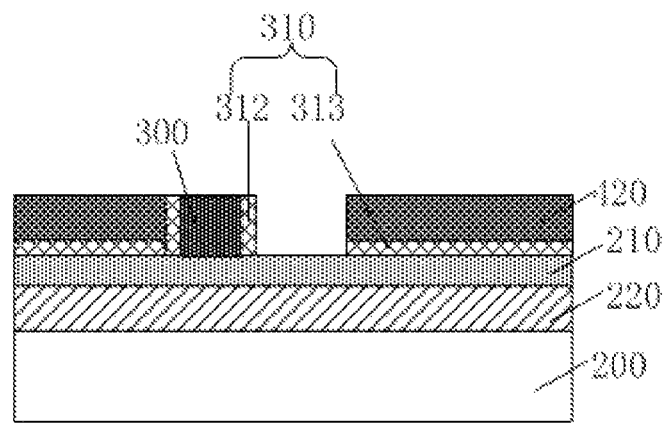

As shown in FIG. 29, the sidewall spacer on the surface of the first mask layer of the second region and the sidewall spacer on the top surface of the core layer are removed (S209). FIG. 19 and FIG. 20 illustrate corresponding semiconductor structures.

FIG. 19 and FIG. 17 provide schematic views of structures of the same top view direction. FIG. 20 and FIG. 18 provide schematic views of structures of the same cross-section. The sidewall spacer 310 on the surface of the first mask layer 210 of the second region A2 and the sidewall spacer 310 on the top surface of the core layer 300 are removed.

In some embodiments, the third sidewall spacer 313 of the second region A2 may be removed to expose the surface of the first mask layer 210 of the second region A2. The first sidewall spacer 311 may be removed to expose the top surface of the core layer 300.

In some embodiments, etching and removing the first sidewall spacer 311 and the third sidewall spacer 313 may include an etching process without a mask.

Figure 21:
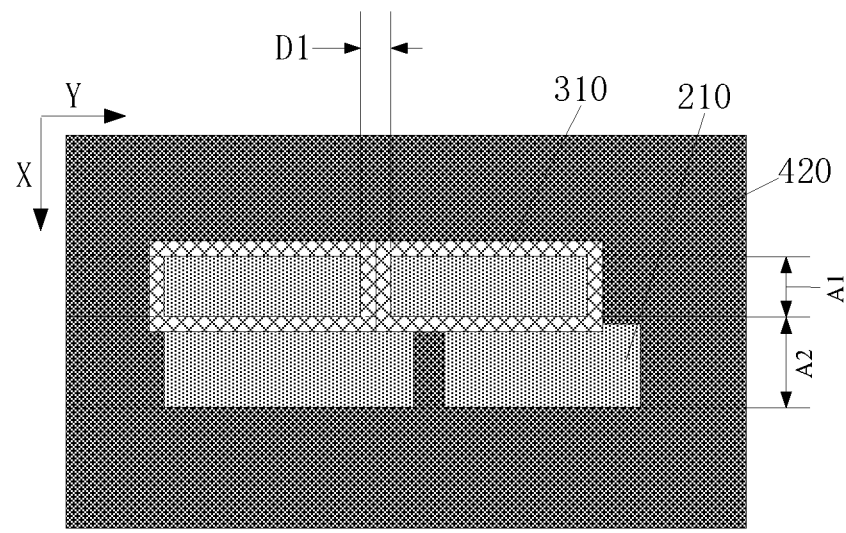
Figure 22:
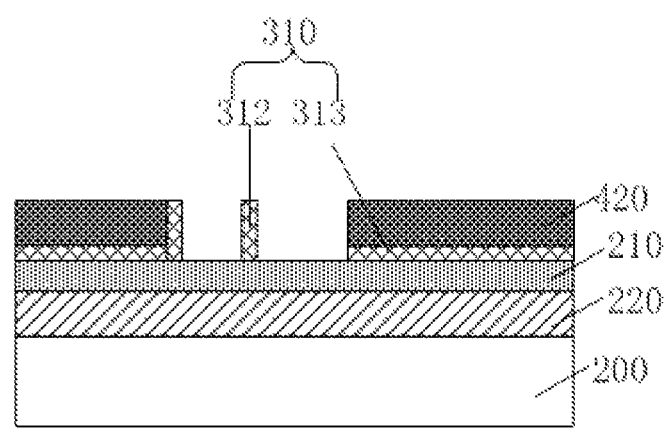

As shown in FIG. 29, the core layer is removed to expose the surface of the first mask layer of the first region (S210). FIG. 21 and FIG. 22 illustrate corresponding semiconductor structures.

FIG. 21 and FIG. 19 provide schematic views of structures of the same top view direction. FIG. 22 and FIG. 20 provide schematic views of structures of the same cross-section. The core layer 300 is removed to expose the surface of the first mask layer 210 of the first region A1.

In some embodiments, a dry etching process may be used to etch and remove the core layer 300.

In some other embodiments, a wet etching process may also be used to etch and remove the core layer 300.

Figure 23:
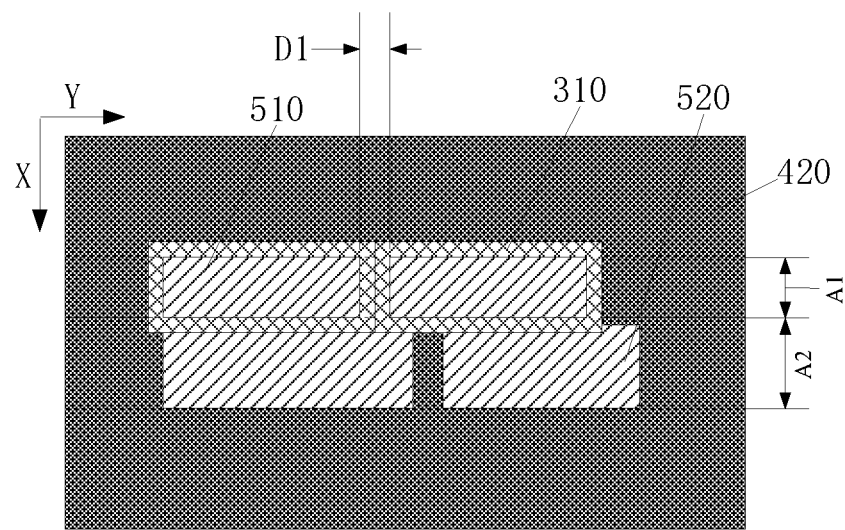
Figure 24:
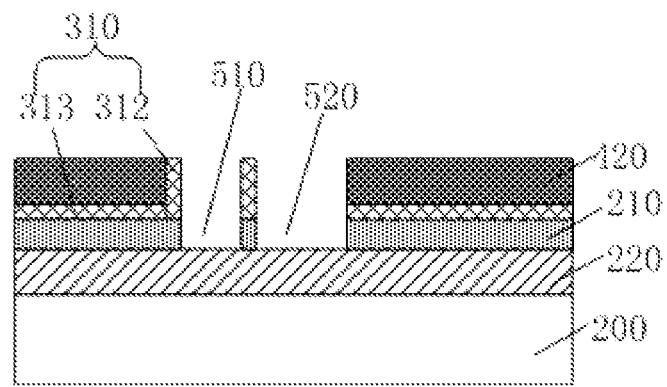

As shown in FIG. 29, the exposed first mask layer of the first region is etched to form a first trench in the first mask layer of the first region, and the exposed first mask layer of the second region is etched and removed to form a second trench in the first mask layer of the second region (S211). FIG. 23 and FIG. 24 illustrate corresponding semiconductor structures.

FIG. 23 and FIG. 21 provide schematic views of structures of the same top view direction. FIG. 24 and FIG. 22 provide schematic views of structures of the same cross-section. The exposed first mask layer 210 of the first region A1 is etched and removed to form a first trench 510 in the first mask layer 210 of the first region A1 and the exposed first mask layer 210 of the second region A2 is etched and removed to form a second trench 520 in the first mask layer 210 of the second region A2.

In some embodiments, etching the first mask layer 210 may include a dry etching process. In some other embodiments, etching and removing the first mask layer 210 may include a wet etching process or a combination of the dry etching process and the wet etching process.

In some embodiments, the remaining second sidewall spacer 312 may maintain a distance between the formed first trench 510 and the second trench 520 along the first direction X. Through the two photolithography-etchings based on a sidewall process, the distance between devices may be further reduced, and the dimension of the devices may be reduced. Meanwhile, the sidewall spacer may be further provided as the alignment reference to reduce the alignment error between the first trench and the second trench.

In some embodiments, the sidewall spacer 310 is located on the surface of the core layer 300, and the first mask layer 210. Therefore, after the first trench 510 is formed, the sidewall spacer 310 is located outside of the first trench 510. The shape of the first trench 510 may be consistent with the shape of the core layer 300. When the shape of the first trench 510 is subsequently transferred to the to-be-etched layer 200, an obtained first target trench may have a shape consistent with the shape of the core layer 300. When a metal is filled in the first target trench to form a first metal layer, no block of the sidewall spacer may exist between neighboring first conductive layers along the second direction Y. The dimension of the HTH between the neighboring conductive layers, that is the dimension of neighboring core layers, matches the expected target. The smallest dimension of the HTH may be determined by the photolithography capability of lithography equipment.

Figure 25:
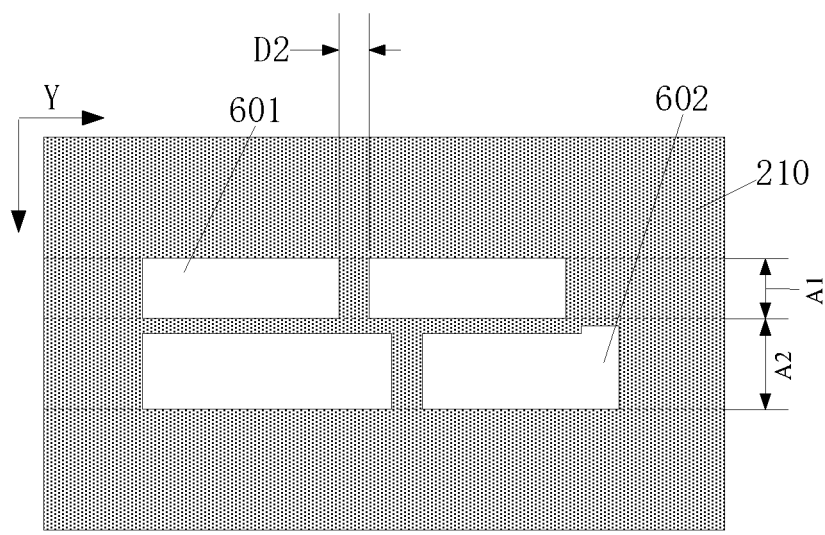
Figure 26:
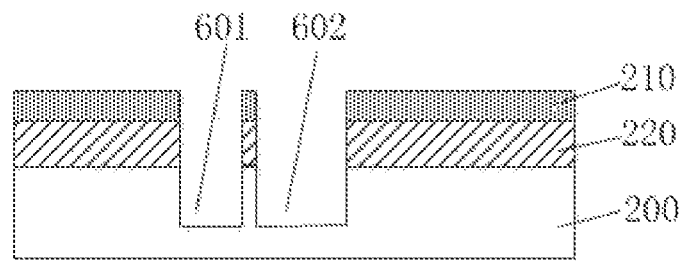

As shown in FIG. 29, after the first trench and the second trench are formed, the second sacrificial layer and the sidewall spacer on the sidewall surface of the remaining core layer is removed, and the first mask layer is used as a mask to etch the bottom hard mask layer and a portion of the to-be-etched layer to form a first target trench in the to-be-etched layer at the bottom of the first trench and a second target trench in the to-be-etched layer at the bottom of the second trench (S212). FIG. 25 and FIG. 26 illustrate corresponding semiconductor structures.

FIG. 25 and FIG. 23 provide schematic views of structures of the same top view direction. FIG. 26 and FIG. 24 provide schematic views of structures of the same cross-section. After the first trench 510 and the second trench 520 are formed, the second sacrificial layer 420 and the sidewall spacer 310 on the sidewall surface of the core layer 30 is removed.

Referring to FIG. 25 and FIG. 26, the first mask layer 210 is used as a mask to etch the bottom hard mask layer 220 and a portion of the to-be-etched layer 200 to form a first target trench 601 in the to-be-etched layer 200 at the bottom of the first trench 510 and a second target trench 602 in the to-be-etched layer 200 at the bottom of the second trench 520.

Using the first mask layer 210 as the mask to etch the bottom hard mask layer 220 and a portion of the to-be-etched layer 200 may include at least one of a dry etching or a wet etching.

In some embodiments, after the first target trench 601 and the second target trench 602 are formed, the first mask layer 210 and the bottom hard mask layer 220 may not be removed first. In some other embodiments, after the first target trench 601 and the second target trench 602 are formed, a portion of the mask layer may be removed first, e.g., the first mask layer 210 may be removed first.

Figure 27:
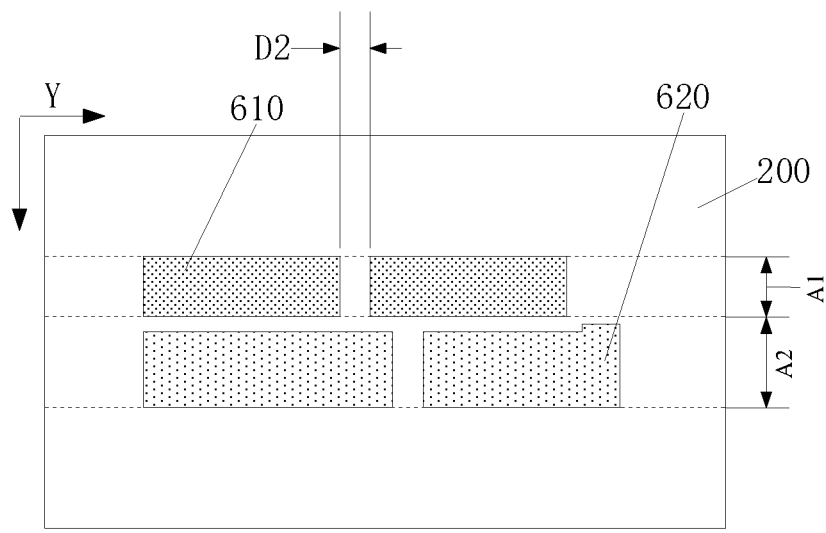

As shown in FIG. 29, after the first target trench and the second target trench are formed, a first conductive layer is formed in the first target trench, and a second conductive layer is formed in the second target trench (S213). FIG. 27 and FIG. 28 illustrate corresponding semiconductor structures.

FIG. 27 and FIG. 25 provide schematic views of structures of the same top view direction. FIG. 28 and FIG. 26 provide schematic views of structures of the same cross-section. After the first target trench 601 and the second target trench 602 are formed, a first conductive layer 610 is formed in the first target trench 601, and a second conductive layer 620 is formed in the second target trench 602.

Forming the first conductive layer 610 includes forming a first conductive film in the first target trench, and planarizing the first conductive film, the first mask layer 210, and the bottom hard mask layer 220 until exposing the to-be-etched layer 200 to form the first conductive layer 610 in the first target trench. The first conductive film may cover the first mask layer 210.

A material of the first conductive film may include a metal, and correspondingly, a material of the first conductive layer may include the metal. In some embodiments, the material of the first conductive layer may include copper. In some other embodiments, the material of the first conductive layer may include aluminum, tungsten, cobalt, etc.

The CVD process or the PVD process may be used to form the first conductive film.

A material and a formation method of the second conductive layer may be the same as the material and the formation method of the first conductive layer, which are not repeated here.

In some embodiments, the HTH between the formed neighboring first conductive layers 610 may be D2 along the second direction Y. Without a sidewall spacer, D2 may be consistent with the HTH D1 of the neighboring core layers 300 along the second direction Y. Therefore, the dimension of the HTH may match the expected target.

As disclosed, the technical solutions of the present disclosure have the following advantages.

Before the first trench and the second trench are formed in the first mask layer, the patterned core layer is formed on the mask layer first, then the sidewall spacer is formed on the surface of the core layer and the surface of the first mask layer, and the first sacrificial layer covering the sidewall spacer on the mask layer of the second region is subsequently formed. On one aspect, the core layer defines the position and dimension of the first trench to be formed. The first sacrificial layer defines the position and dimension of the second trench. The sidewall spacer is used as the alignment reference for forming the first sacrificial layer to reduce the alignment error between the formed second trench and the first trench. On another aspect, the sidewall spacer is formed before the first trench. The core layer and the first mask layer at the bottom of the core layer are etched and removed to form the first trench. After the first trench is formed, the sidewall spacer configured for self-alignment does not need to be formed in the first trench, therefore, the shape of the formed first trench is consistent with the shape of the core layer. When the shape of the first trench is transferred to the to-be-etched layer, the shape of the formed first target trench is consistent with the shape of the core layer. Moreover, when the metal is filled in the first target trench to form the first conductive layer, no sidewall spacer exists between the neighboring first conductive layers to realize a smaller HTH. The HTH between the neighboring first conductive layers is the HTH between the neighboring core layers, which matches the expected target.

Although the present disclosure is disclosed as above, the present disclosure is not limited to this. Those skilled in the art may make various changes and modifications without departing from the spirit and scope of the present disclosure. Therefore, the scope of the present invention shall be subject to the scope defined by the claims.

What is claimed is:

1. A method for forming a semiconductor device, comprising:
    providing a to-be-etched layer including a first region and a second region adjoining the first region;
    forming a first mask layer on the to-be-etched layer;
    forming a patterned core layer on the first mask layer of the first region;
    forming a sidewall spacer on a top surface and a sidewall surface of the core layer and a surface of the first mask layer;
    forming a first sacrificial layer on the sidewall spacer on the surface of the first mask layer of the second region, a top surface of the entire first sacrificial layer being higher than the top surface of the core layer, forming the first sacrificial layer including:
        forming a first sacrificial material layer on a top surface and sidewall surfaces of the sidewall spacer;
        forming a patterned photoresist layer on a top surface of the first sacrificial material layer, the patterned photoresist layer covering the first sacrificial material layer of the second region; and using the patterned photoresist layer as a mask to etch the first sacrificial material layer to form the first sacrificial layer on the sidewall spacer on the surface of the first mask layer of the second region;

forming a second sacrificial layer on the sidewall spacer, the second sacrificial layer exposing the sidewall spacer on the top of the core layer and a top of the first sacrificial layer;

removing the entire first sacrificial layer, the sidewall spacer on the surface of the first mask layer of the second region and the sidewall spacer on the top of the core layer;

removing the core layer after the entire first sacrificial layer is removed;

etching the first mask layer of the first region to form a first trench; and etching the first mask layer of the second region to form a second trench.

2. The method according to claim 1, wherein forming the second sacrificial layer includes:

forming a second sacrificial material layer on a surface of the sidewall spacer and a surface of the first sacrificial layer; and etching back the second sacrificial material layer until exposing the sidewall spacer on the top of the core layer and a top of the first sacrificial layer to form the second sacrificial layer.

3. The method according to claim 2, wherein a material of the second sacrificial layer includes spin-coated carbon, spin-coated glass, spin-coated organic, or spin-coated metal oxide.

4. The method according to claim 3, wherein etching back the second sacrificial layer includes at least one of a dry etching or a wet etching.

5. The method according to claim 1, wherein a material of the first sacrificial layer includes spin-coated carbon, spin-coated glass, spin-coated organic, or spin-coated metal oxide.

6. The method according to claim 5, wherein removing the first sacrificial layer includes at least one of a dry etching or a wet etching.

7. The method according to claim 1, wherein a material of the sidewall spacer includes silicon oxide ($SiO_2$), silicon nitride (SiN), titanium oxide ($TiO_2$), titanium nitride (TiN), aluminum nitride (AlN), or aluminum oxide ($Al_2O_3$).

8. The method according to claim 1, after forming the first trench and the second trench, further comprising: removing the second sacrificial layer and the sidewall spacer on the sidewall surface of the core layer.

9. The method according to claim 8, further comprising:
etching the to-be-etched layer at bottom of the first trench to form a first target trench in the to-be-etched layer of the first region; and etching the to-be-etched layer at bottom of the second trench to form a second target trench in the to-be-etched layer of the second region.

10. The method according to claim 9, further comprising:
forming a first conductive layer in the first target trench; and forming a second conductive layer in the second target trench.

* * * * *